United States Patent

Hauk

[11] Patent Number: 6,049,257
[45] Date of Patent: Apr. 11, 2000

[54] METHOD AND ARRANGEMENT FOR FREQUENCY MODULATION OF A HIGH-FREQUENCY SIGNAL

[75] Inventor: Joachim Hauk, Vaihingen, Germany

[73] Assignee: Robert Bosch GmbH, Stuttgart, Germany

[21] Appl. No.: 09/101,178

[22] PCT Filed: Oct. 2, 1996

[86] PCT No.: PCT/DE96/01897

§ 371 Date: Jun. 30, 1998

§ 102(e) Date: Jun. 30, 1998

[87] PCT Pub. No.: WO97/25773

PCT Pub. Date: Jul. 17, 1997

[30] Foreign Application Priority Data

Jan. 13, 1996 [DE] Germany ............................ 196 01 013

[51] Int. Cl.[7] .................................................. H03C 3/06
[52] U.S. Cl. .............................. 332/127; 331/17; 331/25
[58] Field of Search .................................. 331/17, 25, 27; 332/100, 127, 128

[56] References Cited

U.S. PATENT DOCUMENTS

| 3,989,931 | 11/1976 | Phillips | 235/92 |
| 5,184,093 | 2/1993 | Itoh et al. | 331/25 |
| 5,216,389 | 6/1993 | Carralero et al. | 331/18 |
| 5,379,002 | 1/1995 | Jokura | 331/10 |
| 5,757,239 | 5/1998 | Gilmore | 331/18 |

*Primary Examiner*—Robert Pascal
*Assistant Examiner*—Henry Choe
*Attorney, Agent, or Firm*—Kenyon & Kenyon

[57] ABSTRACT

In a method and an arrangement for frequency modulation of a high-frequency signal, where the high-frequency signal is generated with an oscillator which is controlled by comparison of an actual frequency signal with a variable set frequency signal, the actual frequency signal contains pulses with an average repetition frequency which corresponds to an actual frequency, with one pulse being derived from one edge of the high-frequency signal and its phase angle being determined by a predetermined clock pulse. The set frequency signal comprises pulses with an average repetition frequency which corresponds to a set frequency. The pulses increment or decrement an up/down counter from whose count a control voltage is derived for the oscillator.

14 Claims, 3 Drawing Sheets

METHOD AND ARRANGEMENT FOR FREQUENCY MODULATION OF A HIGH-FREQUENCY SIGNAL

FIELD OF THE INVENTION

The present relates to a method and an arrangement for frequency modulation of a high-frequency signal, the high-frequency signal being generated with an oscillator that is regulated by comparison of an actual frequency signal with a variable set frequency signal.

BACKGROUND INFORMATION

In radar technology, in particular with range finders, a time-linear frequency modulation is often needed in the form of up and down ramps. High demands are made of the linearity and symmetry of the ramps.

SUMMARY OF THE INVENTION

An object of the present invention is to create a method and an arrangement for frequency modulation of a high-frequency signal with which a high accuracy is achieved at a low cost.

With the method according to the present invention, this object is achieved by the fact that the actual frequency signal comprises pulses with an average repetition frequency which corresponds to an actual frequency, with each pulse being derived from an edge of the high-frequency signal and its phase angle being determined by a predetermined clock pulse; the set frequency signal comprises pulses with an average repetition frequency corresponding to a set frequency; and the pulses increment or decrement an up/down counter from whose count a control voltage is derived for the oscillator.

Derivation of the edges of the high-frequency signal can be accomplished in various ways with the method according to the present invention. At very high frequencies, such as those occurring with the preferred application of the method according to the present invention, it is advantageous if the high-frequency signal of the oscillator is mixed with a signal of a high-precision reference oscillator before extracting the actual frequency signal, and the actual frequency signal is formed from the resulting mixed product. In an alternative exemplary embodiment of the present invention, means are provided so that the signal originating from or derived from the oscillator is subjected to a frequency division before forming the actual frequency signal.

The method according to the present invention has the advantage that the accuracy achieved using digital circuits, so that adjustment is not needed in production or later. Similarly, no measures are needed for compensation for temperature or aging effects.

The actual frequency signal obtained with the method according to the present invention contains pulses whose interval is subject to fluctuations according to the random phase angle of the clock pulse and of the signal derived from the high-frequency signal. On the average, however, the resulting frequency corresponds to the frequency of the signal derived from the high-frequency signal—i.e., it represents the frequency of the high-frequency signal.

Preferably, a current in a first direction or in a second, opposite direction is supplied to a capacitor in order to derive the control voltage in the method according to the present invention as a function of the sign of the count.

According to a further improvement of the method according to the present invention, a variable number is added to the contents of an accumulator at the given clock rate to derive the set frequency signal, and a pulse of the set frequency signal is output when the most significant bit of the accumulator contents jumps to a predetermined binary value. Here again, a pulse train is generated in which the pulses have different intervals but the frequency corresponds on the average to the set frequency.

In this further development, the slope of the ramps can preferably be determined by storing the variable number to be added in another up/down counter and varying it by incrementing and decrementing the counter as a function of modulation signals supplied.

In the method according to the present invention, for selecting a start frequency, the up/down counter can be set at a starting value which, by repeated addition to the respective accumulator contents, results in an actual frequency signal corresponding to a non-frequency-modulated high-frequency signal.

With the most common application of the method according to the present invention, i.e., in generation of time-linear ramps, it is provided that a binary signal can be supplied to each up and a down input of the up/down counter, said binary signal causing a linear increase or a linear decrease in frequency. However, if the frequency is not to change in a time-linear manner, then it is also quite possible for the counter to be incremented and decremented as a predetermined function of time.

For various applications, it is necessary to modify the slope of the ramps. Therefore, with the method according to the present invention, the slope of the linear rise or drop can be reduced by interrupting the binary signals during a portion of the clock periods. In particular, the slope can be reduced by half by supplying the binary signals only during every second clock pulse.

The object according to the present invention is achieved with an arrangement for carrying out the method due to the fact that the signal derived from the high-frequency signal can be sent to an edge detector, one output of the edge detector is connected to a first counting input of an up/down counter, one output of a generator that generates pulses with an average frequency corresponding to the set frequency is connected to a second counting input, and the up/down counter is connected to means for deriving a control voltage from the count. This arrangement contains mostly digital circuits which can be implemented in the form of integrated circuits.

Preferably with the arrangement according to this invention, the means for deriving a control voltage comprise two current sources which supply current to a capacitor in opposite directions and one of which is switched into circuit or, if the count "0" is analyzed separately, neither is switched into circuit temporarily as a function of the sign of the count.

In an advantageous exemplary embodiment of the present invention, the generator contains an accumulator to whose contents the contents of another up/down counter are added in the predetermined clock pulse, and the additional up/down counter can be incremented or decremented in the predetermined clock pulse as a function of modulation signals.

DETAILED DESCRIPTION OF THE INVENTION

Figure 1:
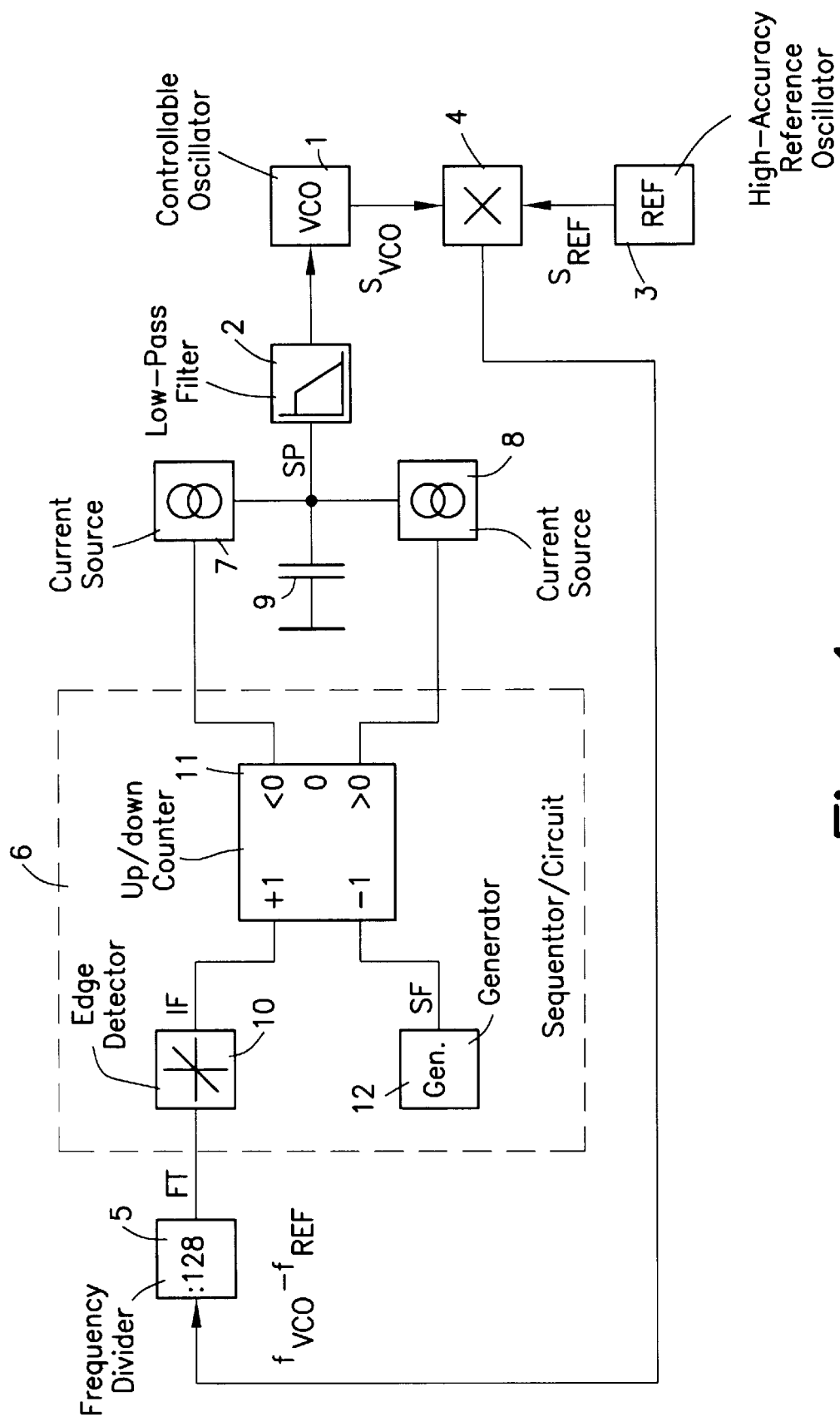
FIG. 1 shows a diagram of an arrangement according to the present invention.

With the arrangement according to FIG. 1, the high-frequency signal is generated in a controllable oscillator 1 to which a control voltage SP is sent via a low-pass filter 2 for setting the frequency. A frequency range of 76 GHz to 77 GHz has been approved for range finders. Since signals with this frequency cannot be processed readily with circuit arrangements such as frequency dividers, the high-frequency signal $S_{VCO}$ is mixed with a signal $S_{REF}$ of a high-accuracy reference oscillator 3. The mixed signal $|f_{VCO}-f_{REF}|$ is sent to a frequency divider 5 which divides the frequency by 128 in the case of this exemplary embodiment. Output signal FT of frequency divider 5 is a square-wave signal with a frequency in the range of 2.625 MHZ to 4.576 MHZ.

Figure 2:
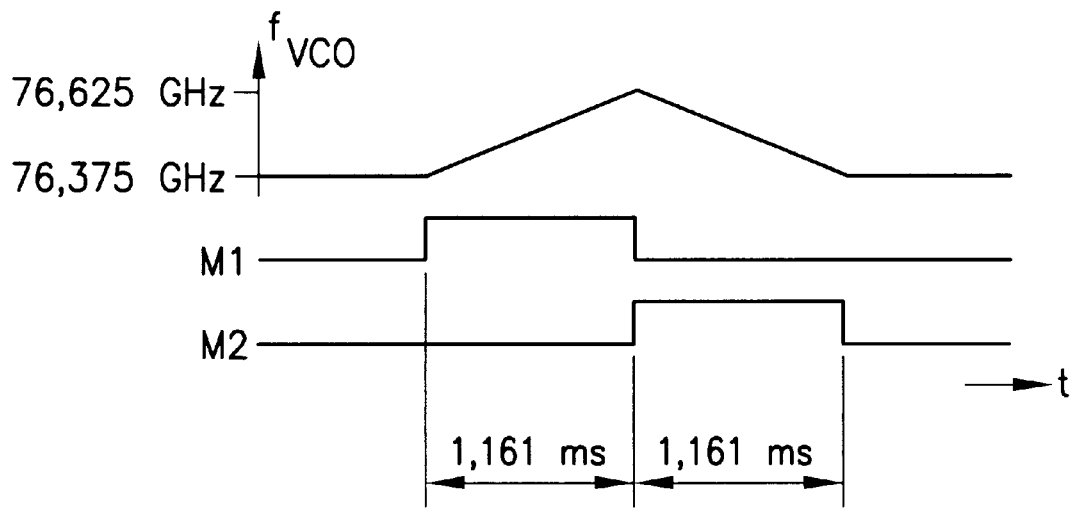
FIG. 2 shows a frequency variation of a high-frequency signal in ramp modulation and a variation of a respective modulation signals that can be supplied to the arrangement.

Frequency $f_{VCO}$ is now to be modulated according to FIG. 2, i.e., the frequency is to increase linearly by 250 MHZ from a rest frequency of 76.375 GHz, for example, within 1.161 ms and then drop again to 76.375 GHz within 1.161 ms. The increase and decrease are to take place during one of modulation signals M1 or M2.

To generate this characteristic, control voltage SP, which is supplied to controllable oscillator 1 via low-pass filter 2, is formed using a synchronous sequential circuit 6 comprising two current sources 7, 8 and a capacitor 9. Synchronous sequential circuit 6 comprises an edge detector 10, an up/down counter 11 and a generator 12 for the set frequency signal.

Figure 3:
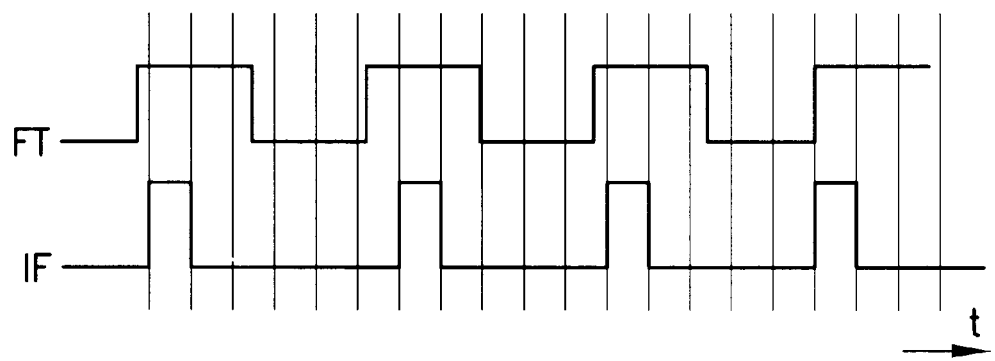
FIG. 3 shows time diagrams to illustrate a derivation of the actual frequency signal.

Edge detector 10 causes a "1" to be output after each positive edge of the output signal of frequency divider 5 for the duration of a period of a clock pulse CL that is supplied. This process is illustrated in FIG. 3 on the basis of time diagrams of signals FT and IF, where the vertical lines represent clock pulse CL, and the frequency-response ratio shown has been selected arbitrarily. The edges of signal FT correspond to the zero crossings of a sinusoidal signal or a square-wave signal alternating between positive and negative values. Since the edges of signal FT are not synchronized with clock pulse CL, and furthermore, since the clock frequency is not much greater than the frequency of signal FT, the pulses of the actual frequency signal IF have different intervals, but the average frequency corresponds to the frequency of signal FT, which is referred to below as the actual frequency, although it differs from the actual frequency of the high-frequency signal.

A generator 12 generates pulses whose average frequency corresponds to the setpoint of the frequency of signal and FT. Signals IF SF are each sent to one input of up/down counter 11, with one pulse of signal IF triggering incrementation of the count, and one pulse of signal SF triggering decrementation of the count. If two pulses arrive simultaneously, the count remains the same.

If the actual frequency is smaller than the set frequency, pulses of signal SF will arrive more frequently than those of signal IF. The count then becomes negative. A signal indicating the negative count is sent to a current source 7, which charges capacitor 9 in the sense of raising the frequency. However, if the actual frequency is higher than the set frequency, the count becomes positive and current source 8 is controlled to act in the sense of lowering the frequency.

Figure 4:
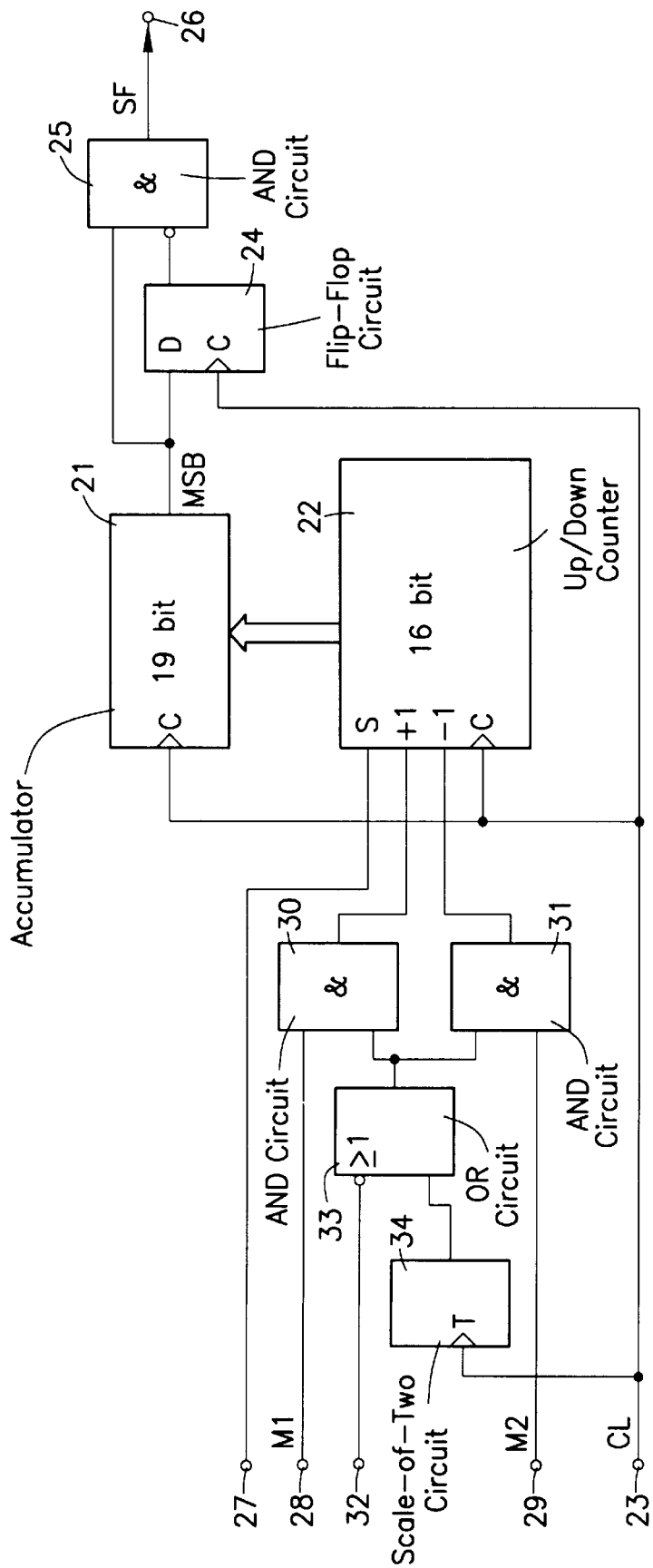
FIG. 4 shows a generator for generating a set frequency signal.

FIG. 4 shows an exemplary embodiment of a generator 12 (FIG. 1). An accumulator 21 with a capacity of 19 bits is cycled together with an up/down counter 22 with a clock pulse CL supplied at 23. With each clock pulse, the contents of accumulator 21 are increased by the respective count. The most significant bit (MSB) is removed from the accumulator. With the help of a D flip-flop 24, which is also cycled with CL, and an AND circuit 25, a pulse whose width corresponds to the period of clock pulse CL is obtained after each jump in the MSB from "0" to "1." These pulses are sent as signal SF to up/down counter 11 (FIG. 1).

An initial value for up/down counter 22 is sent to an input 27. This value is, for example, B000(hex), which means a start frequency of 336 MHZ. At a clock frequency of 21 MHZ, there are 24381 clock pulses for a 1.161 ms ramp. The frequency deviation amounts to 250 MHZ if up/down counter 22 is incremented or decremented by "1" for each clock pulse. Therefore, modulation signals M1 and M2 shown in FIG. 2 are sent to inputs 28, 29. In this case, AND circuits 30, 31 then constantly allow signals M1 and M2 to pass through.

To reduce the slope of the ramps, a "1" is sent to an inverting input of an OR circuit 33 via an input 32. The other input of OR circuit 33 receives the output signal of a scale-of-two circuit 34 which is cycled with clock pulse CL. OR circuit 33 then relays a "1" or a "0" alternately to AND circuits 30, 31, so that there is no incrementation or decrementation of up/down counter 22 during every second clock pulse.

To achieve a ramp with the full slope, a "0" is sent to input 32 and is relayed to AND circuits 30, 31 as a "1" by OR circuit 33 regardless of the level at the other input, so that signals M1 and M2 are not interrupted.

What is claimed is:

1. A method for frequency modulating a high-frequency signal, comprising the steps of:
    generating the high-frequency signal using an oscillator, the oscillator being regulated by comparing an actual frequency signal to a variable set frequency signal;
    adjusting an up/down counter using at least one of: a plurality of first pulses of the actual frequency signal and a plurality of second pulses of the variable set frequency signal; and
    determining a control voltage for the oscillator using the up/down counter,
    wherein the plurality of first pulses include an average repetition frequency corresponding to an actual frequency of the actual frequency signal,
    wherein the plurality of second pulses include an average repetition frequency corresponding to a set frequency of the variable set frequency signal, and
    wherein the up/down counter is adjusted in a first counting direction using the plurality of first pulses, and wherein the up/down counter is adjusted in a second counting direction using the plurality of second pulses, the second counting direction being opposite to the first counting direction.

2. The method according to claim 1, further comprising the steps of:
    determining the plurality of first pulses using at least one edge of the high-frequency signal; and
    determining a phase angle of the plurality of first pulses using a predetermined clock pulse.

3. The method according to claim 1, further comprising the steps of:
    before the actual frequency signal is determined, mixing the high-frequency signal with a signal of a high-precision reference oscillator to determine a mixed signal; and determining the actual frequency signal using the mixed signal.

4. The method according to claim 1, further comprising the step of:

before formation of the actual frequency signal, subjecting the high-frequency signal to a frequency division.

5. The method according to claim 1, further comprising the step of:

providing a current to a capacitor in one of a first direction and a second direction as a function of a sign of the up/down counter to determine the control voltage, wherein the first direction is opposite to the second direction.

6. The method according to claim 2, further comprising the steps of:

adding a variable number to a content value of an accumulator in the predetermined clock pulse to determine the set frequency signal; and when a most significant bit of the content value jumps to a predetermined binary value, outputting a pulse of the plurality of second pulses.

7. The method according to claim 6, further comprising the steps of:

storing the variable number in a further up/down counter; and adjusting the variable number by adjusting the up/down counter as a function of at least one modulation signal.

8. The method according to claim 7, further comprising the steps of:

setting the further up/down counter to a starting value;

repeatedly adding the starting value to a corresponding content value of the accumulator; and determining the actual frequency signal corresponding to a non-frequency-modulated signal using the starting value.

9. The method according to claim 7, further comprising the step of:

providing at least one binary signal causing one of a linear increase and a linear decrease in frequency to a first input of the further up/down counter and a second input of the further up/down counter.

10. The method according to claim 9, further comprising the step of:

reducing a slope of the one of the linear increase and the linear decrease using the at least one binary signal being interrupted during a portion of a plurality of clock pulse periods.

11. The method according to claim 10, wherein the at least one binary signal is provided only during every second clock pulse of the plurality of clock pulse periods, and further comprising the step of reducing the slope by a half.

12. An arrangement for a frequency modulation of a high-frequency signal, comprising:

an oscillator generating the high-frequency signal;

a first arrangement determining an actual frequency signal using the high-frequency signal;

a generator generating a variable set frequency signal;

an up/down counter including a counter value; and a second arrangement determining a control voltage for the oscillator using the counter value, the second arrangement coupled to the up/down counter, wherein the actual frequency signal includes a plurality of first pulses having an average repetition frequency corresponding to an actual frequency of the actual frequency signal, the actual frequency signal being transmitted to a first counter input of the up/down counter, wherein the set frequency signal includes a plurality of second pulses having an average repetition frequency corresponding to a set frequency of the variable set frequency signal, the set frequency signal being transmitted to a second counter input of the up/down counter and wherein the plurality of first pulses adjust the up/down counter in a first counter direction, and the plurality of second pulses adjust the up/down counter in a second counter direction, the first counter direction being opposite to the second counter direction.

13. The arrangement according to claim 12, wherein the second arrangement includes a first current source, a second current source and a capacitor, wherein the first current source supplies a current to the capacitor in a first current direction, the second current source supplies the current to the capacitor in a second current direction, and the first current direction is opposite to the second current direction and wherein one of the first current source and the second current source is switched into a circuit as a function of a sign of the counter value.

14. The arrangement according to 12, further comprising:

a further up/down counter including a further counter value, wherein the generator includes an accumulator having a content value, the content value being added to the further counter value at a predetermined clock rate, and the further counter value being adjusted as a function of at least one modulation signal in a predetermined clock pulse.

* * * * *